(12) United States Patent
Iwamoto

(10) Patent No.: US 12,719,427 B2
(45) Date of Patent: Aug. 25, 2026

(54) CONTROL CIRCUIT AND VOLTAGE OUTPUT CIRCUIT

(71) Applicant: FUJI ELECTRIC CO., LTD., Kawasaki (JP)

(72) Inventor: Motomitsu Iwamoto, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 442 days.

(21) Appl. No.: 18/521,355

(22) Filed: Nov. 28, 2023

(65) Prior Publication Data

US 2024/0258980 A1 Aug. 1, 2024

(30) Foreign Application Priority Data

Jan. 30, 2023 (JP) ................................ 2023-011536

(51) Int. Cl.
*H03F 3/45* (2006.01)
*H03F 1/56* (2006.01)

(52) U.S. Cl.
CPC .................... *H03F 3/45269* (2013.01); *H03F 2203/45116* (2013.01)

(58) Field of Classification Search
CPC ....... H03F 3/45269; H03F 2203/45116; H03F 3/3022; H03F 3/45183
USPC ................................................. 330/252–261
See application file for complete search history.

(56) References Cited

U.S. PATENT DOCUMENTS 8,289,302 B2 * 10/2012 Chen ................. H03K 17/0412 345/204

FOREIGN PATENT DOCUMENTS

JP 2005-278056 A 10/2005

* cited by examiner

*Primary Examiner* — Hieu P Nguyen
(74) *Attorney, Agent, or Firm* — Rabin & Berdo, P.C.

(57) ABSTRACT

A control circuit configured to control an operational amplifier circuit that includes a first current source generating a first current according to a power supply voltage and a bias voltage, a first differential pair receiving a pair of input voltages and allowing the first current to flow therethrough, and a first output circuit applying an output voltage according to the input voltages to an output node. The control circuit includes: a second current source generating a second current according to the power supply voltage and the bias voltage; a second differential pair receiving the input voltages and allowing the second current to flow therethrough; and an output control circuit that causes a level at the output node to be a predetermined level, and causes the output voltage to be applied the output node, respectively before and after the level of the power supply voltage reaches a predetermined level.

8 Claims, 7 Drawing Sheets

CONTROL CIRCUIT AND VOLTAGE OUTPUT CIRCUIT

CROSS-REFERENCE TO RELATED APPLICATION

The present application claims priority pursuant to 35 U.S.C. § 119 from Japanese patent application number 2023-011536 filed on Jan. 30, 2023, the entire disclosure of which is hereby incorporated by reference herein.

BACKGROUND

Technical Field

The present disclosure relates to a control circuit and a voltage output circuit.

Description of the Related Art

If the level of a power supply voltage is low when raising a power supply voltage, the output of the operational amplifier circuit may be at an unintended level. Thus, there are control circuits to disable the output of an operational amplifier circuit until the level of power supply voltage reaches the level at which the operational amplifier circuit is able to output a desired voltage corresponding to an input voltage (for example, Japanese Unexamined Patent Application Publication No. 2005-278056).

However, such a control circuit typically use a reference voltage from a reference voltage circuit in determining the level of the power supply voltage. Accordingly, considering variations in the reference voltage circuits, the level of the power supply voltage at which the output of the operational amplifier circuit is enabled may vary.

SUMMARY

One aspect of the present disclosure is a control circuit configured to control an output node of an operational amplifier circuit that includes a first current source configured to generate a first current according to a power supply voltage and a bias voltage, a first differential pair allowing the first current to flow therethrough, the first differential pair being configured to receive input voltages, and a first output circuit configured to apply an output voltage according to the input voltages, to the output node, in response to the power supply voltage exceeding a first level, the control circuit comprising: a second current source configured to generate a second current according to the power supply voltage and the bias voltage; a second differential pair allowing the second current to flow therethrough, the second differential pair being configured to receive the input voltages; and an output control circuit coupled to the second differential pair, the output control circuit being configured to control a state of the output node, wherein the output control circuit causes a level at the output node to be a predetermined level, until a level of the power supply voltage reaches the first level, and applies the output voltage to the output node, in response to the level of the power supply voltage exceeding the first level.

Another aspect of the present disclosure is a voltage output circuit comprising: an operational amplifier circuit; and a control circuit configured to control a state of an output node of the operational amplifier circuit, wherein the operational amplifier circuit includes a first current source configured to generate a first current according to a power supply voltage and a bias voltage; a first differential pair allowing the first current to flow therethrough, the first differential pair configured to receive input voltages; and a first output circuit configured to apply an output voltage according to the input voltages to the output node, in response to the level of the power supply voltage exceeding a first level, the control circuit includes a second current source configured to generate a second current according to the power supply voltage and the bias voltage; a second differential pair allowing the second current to flow therethrough, the second differential pair being configured to receive the input voltages; and an output control circuit coupled to the second differential pair, the output control circuit being configured to control a state of the output node, and the output control circuit causes a level at the output node to be a predetermined level, until a level of the power supply voltage reaches the first level, and applies the output voltage to the output node, in response to the level of the power supply voltage exceeding the first level.

DETAILED DESCRIPTION

Figure 1:
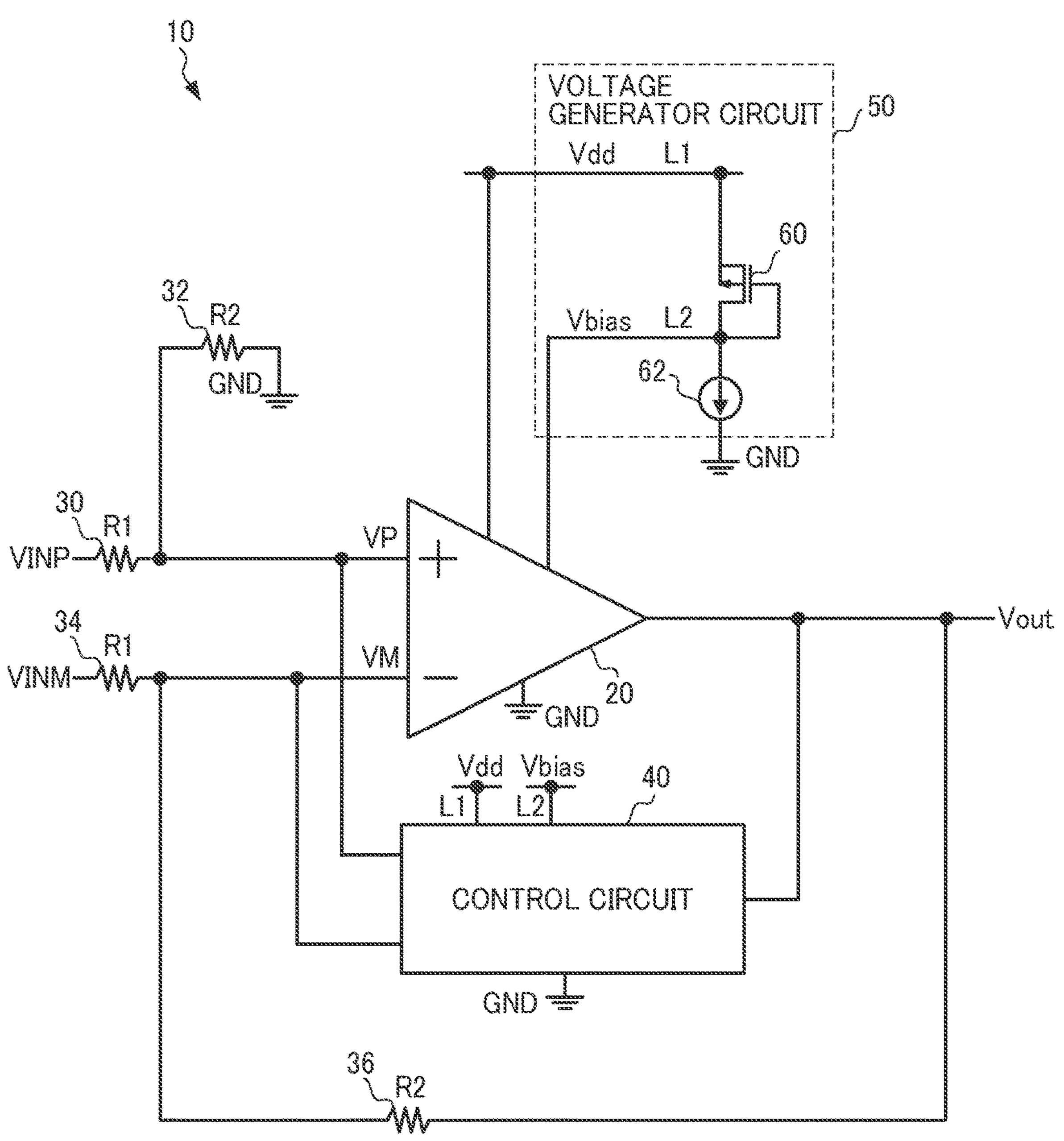
FIG. 1 is a diagram illustrating a configuration example of a voltage output circuit 10.

At least following matters will become apparent from the descriptions of the present specification and the accompanying drawings.

Hereinafter, embodiments of the present disclosure will be described with reference to the drawings. The same or equivalent constituent elements, members, and the like illustrated in the drawings are given the same reference numerals, and repetitive description is omitted as appropriate.

EMBODIMENTS

<<Voltage Output Circuit 10>>

FIG. 1 is a diagram illustrating a configuration example of a voltage output circuit 10. The voltage output circuit 10 outputs a desired output voltage Vout corresponding to the difference between a voltage VINP and a voltage VINM, and includes an operational amplifier circuit 20, resistors 30, 32, 34, and 36, a control circuit 40, a voltage generator circuit 50. Note that the voltage output circuit 10 is implemented as an integrated circuit.

The operational amplifier circuit 20 outputs the output voltage Vout according to input voltages VP and VM, which will be described later in detail. Further, a power supply voltage Vdd and a bias voltage Vbias from the voltage generator circuit 50 are applied to the operational amplifier circuit 20.

The resistors 30, 32, 34, and 36 are elements configuring a differential amplifier circuit, with the operational amplifier circuit 20. Specifically, the resistors 30 and 32 configure a voltage divider circuit to divide the voltage VINP, and the input voltage VP obtained by dividing the voltage VINP by the resistors 30 and 32 is applied to the non-inverting input of the operational amplifier circuit 20. Accordingly, the input voltage VP is given as follows, with the resistance value R1 of the resistor 30 and the resistance value R2 of the resistor 32.

$$VP = VINP \times R2/(R1 + R2) \quad \text{Expression (1)}$$

Further, the resistor 34 is provided between the node to receive the voltage VINM and the inverting input of the operational amplifier circuit 20, and the resistor 36 is provided between the output node of the operational amplifier circuit 20 and the inverting input thereof. Thus, the input voltage VM applied to the inverting input of the operational amplifier circuit 20 is given as follows, using the resistance value R1 of the resistor 34 and the resistance value R2 of the resistor 36.

$$VM = (Vout - VINM) \times R1/(R1 + R2) + VINM \quad \text{Expression (2)}$$

Here, the output voltage Vout of the operational amplifier circuit 20 is fed back to the inverting input through the resistor 36, and thus the operational amplifier circuit 20 operates such that the input voltage VP is substantially equal to the input voltage VM. Accordingly, in an embodiment of the present disclosure, the output voltage Vout of the operational amplifier circuit 20 is obtained as follows, based on Expressions (1) and (2).

$$Vout = (VINP - VINM) \times R1/R2 \quad \text{Expression (3)}$$

At the rising of the power supply voltage Vdd, the output voltage Vout of the operational amplifier circuit 20 may result in an unintended level if the power supply voltage Vdd is low.

Accordingly, the control circuit 40 in an embodiment of the present disclosure disables the output of the operational amplifier circuit 20 until the operational amplifier circuit 20 operates stably, which will be described later in detail. Note that the level of the power supply voltage Vdd at which the operational amplifier circuit 20 operates stably is referred to as level V1 (first level).

The voltage generator circuit 50 generates the bias voltage Vbias according to the power supply voltage Vdd, and includes a constant current source 62 and a diode-coupled P-channel metal-oxide-semiconductor (PMOS) transistor 60.

Specifically, in response to the PMOS transistor 60 being turned on according to the power supply voltage Vdd and the current flowing from the constant current source 62, the voltage generator circuit 50 outputs the bias voltage Vbias obtained by lowering the power supply voltage Vdd by an amount corresponding to a voltage drop in the PMOS transistor 60.

<<<Operational Amplifier Circuit 20>>>

==Configuration of Operational Amplifier Circuit 20==

Figure 2:
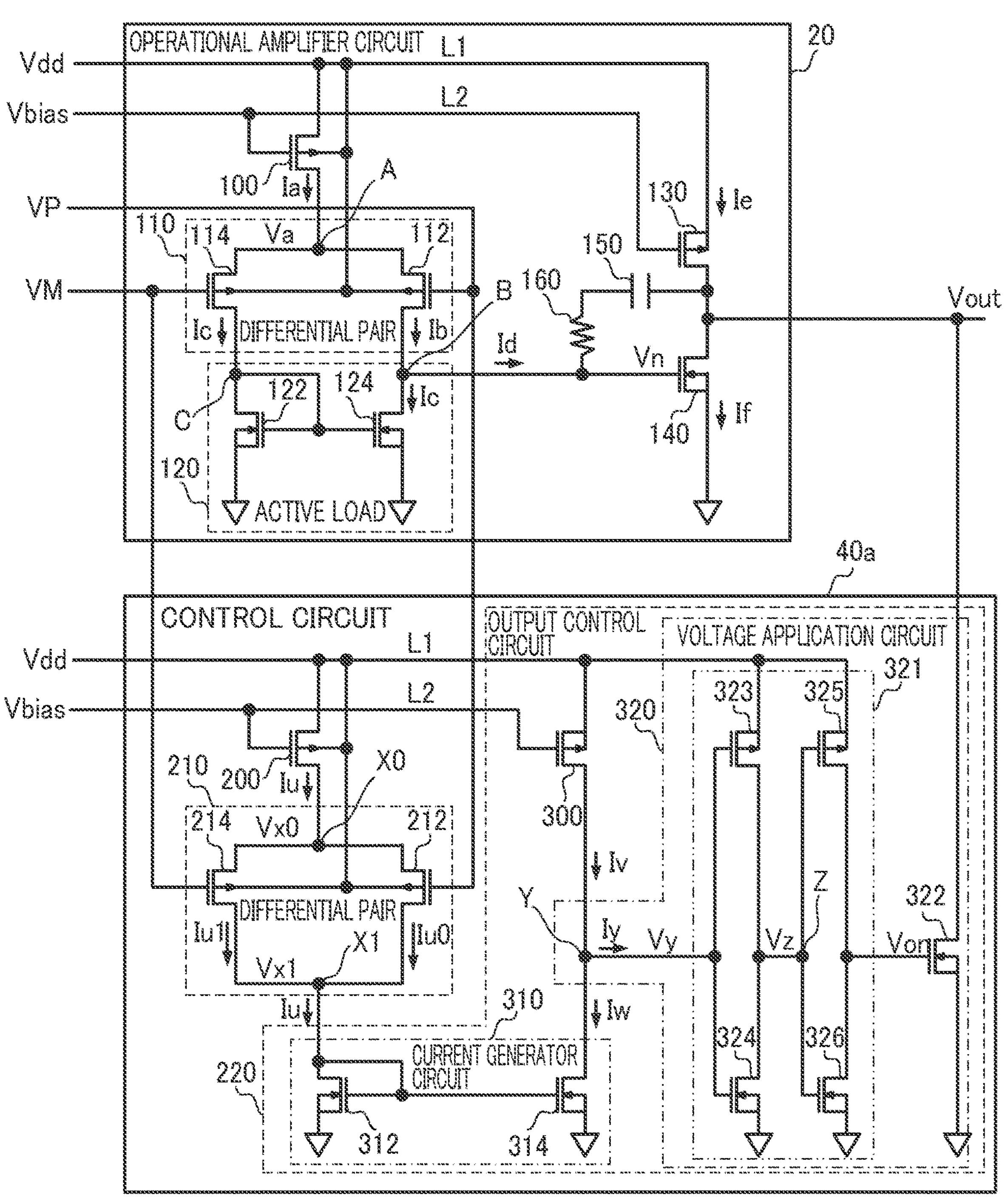
FIG. 2 is a diagram illustrating configuration examples of an operational amplifier circuit 20 and a control circuit 40*a*.

FIG. 2 is a diagram illustrating configuration examples of the operational amplifier circuit 20 and the control circuit 40*a*. The operational amplifier circuit 20 outputs the output voltage Vout, based on the input voltage VP applied to the non-inverting input thereof and the input voltage VM applied to the inverting input thereof. However, as described above, in an embodiment of the present disclosure, since the voltage output circuit 10 operates as a differential amplifier circuit. Thus, the voltage values of the input voltages VP and VM are substantially equal. Note that when receiving the power supply voltage Vdd at a target level (e.g., 5 V), the operational amplifier circuit 20 outputs a desired output voltage Vout according to the input voltages VP and VM.

The operational amplifier circuit 20 includes PMOS transistors 100 and 130, a differential pair 110, an active load 120, an N-channel metal-oxide-semiconductor (NMOS) transistor 140, a capacitor 150, and a resistor 160.

<<PMOS Transistor 100>>

The PMOS transistor 100 operates as a current source to pass a current to the differential pair 110. Specifically, the PMOS transistor 100 has a source electrode coupled to a power supply line L1, and a gate electrode to receive the bias voltage Vbias. The PMOS transistor 100 then generates a current Ia, to pass it from its drain electrode to the differential pair 110.

Further, the PMOS transistor 100 receives, upon turning on of the PMOS transistor 60 in FIG. 1, a gate voltage to pass the current Ia, if the voltage at the drain electrode satisfies a predetermined condition. Note that the PMOS transistors 100 corresponds to a "third current source", and the current Ia corresponds to a "first current".

<<Differential Pair 110>>

The differential pair 110 is a circuit coupled to the PMOS transistor 100, to divide the current Ia based on the input voltages VP and VM, and includes the PMOS transistors 112 and 114. Further, in the PMOS transistors 112 and 114, the on-resistances change according to the input voltages VP and VM applied to the gate electrodes thereof, respectively.

As a result, the PMOS transistors 112 and 114 divide the current Ia according to the respective on-resistances, to thereby pass the divided currents as currents Ib and Ic, respectively. Further, when the input voltage VP is higher than the input voltage VM, the on-resistance of the PMOS transistor 112 is larger than the on-resistance of the PMOS transistor 114. In this case, the differential pair 110 divides the current Ia such that the current Ic is larger than the current Ib.

Meanwhile, when the input voltage VP is lower than the input voltage VM, the on-resistance of the PMOS transistor 112 is smaller than the on-resistance of the PMOS transistor 114. In this case, the differential pair 110 divides the current Ia such that the current Ib is larger than the current Ic. The node at which the source electrodes of the PMOS transistors 112 and 114 are coupled to the drain electrode of the PMOS transistor 100 is referred to as node A, and the voltage at the node A is referred to as voltage Va.

In an embodiment of the present disclosure, in response to the power supply voltage Vdd exceeding the level V1, the level of voltage Va also rises, and the differential pair 110 divides the current Ia to pass divided currents. Note that the differential pair 110 corresponds to a "first differential pair," and the PMOS transistors 112 and 114 correspond to "a plurality of transistors".

<<Active Load 120>>

The active load 120 is used to compare the currents Ib and Ic from the differential pair 110, and configures a current mirror circuit to pass the current Ic to a node B, which is the output of the differential pair 110.

Specifically, the active load 120 includes a diode-coupled NMOS transistor 122 to pass the current Ic, and an NMOS transistor 124 having a gate electrode to receive a gate voltage common to that of the NMOS transistor 122 and a source electrode that is grounded.

Further, the drain electrode of the NMOS transistor 122 is coupled to the drain electrode of the PMOS transistor 114 of the differential pair 110 at a node C. Further, the drain electrode of the NMOS transistor 124 is coupled to the drain electrode of the PMOS transistor 112 of the differential pair 110, at the node B.

Accordingly, the current Id for charging and discharging the gate electrode of the NMOS transistor 140 changes at the node B, with the magnitudes of the current amount of the current Ib from the PMOS transistor 112 and the current Ic passed by the NMOS transistor 124, at the node B. Further, in association with a change in the current Id, the gate voltage Vn of the NMOS transistor 140 changes as well as the voltage at the node B changes as well.

Specifically, when the current Ia flows and the input voltage VP is higher than the input voltage VM, the current Ic is larger than the current Ib, so that the current Id flows so as to discharge the gate electrode of the NMOS transistor 140.

Meanwhile, when the current Ia flows and the input voltage VP is lower than the input voltage VM, the current Ic becomes smaller than the current Ib, and the current Id flows so as to charge the gate electrode of the NMOS transistor 140.

====PMOS Transistor 130 and NMOS Transistor 140====

The PMOS transistor 130 and the NMOS transistor 140 configure an output stage to output the output voltage Vout, based on the gate voltage Vn of the NMOS transistor 140.

The PMOS transistor 130 operates as a current source to pass a current to the output node of the operational amplifier circuit 20. Specifically, the PMOS transistor 130 has a source electrode coupled to the power supply line L1 and a gate electrode to receive the bias voltage Vbias. Then, the PMOS transistor 130 generates a current Ie, and passes the current Ie from its drain electrode to the output the node.

In addition, the PMOS transistor 130, as with the PMOS transistor 100, receives the gate voltage to pass the current Ie if the voltage at the drain electrode satisfies a predetermined condition, upon turning on of the PMOS transistor 60 in FIG. 1.

The NMOS transistor 140 is an amplification stage to pass a current If based on the gate voltage Vn corresponding to the current Id. Specifically, the NMOS transistor 140 increases the current If flowing through the NMOS transistor 140 since the gate voltage Vn rises in response to the current Id flowing so as to charge the gate electrode thereof. Meanwhile, the NMOS transistor 140 reduces the current If since the gate voltage Vn drops in response to the current Id flowing so as to discharge the gate electrode thereof.

Further, the output voltage Vout applied to the output node of the operational amplifier circuit 20 rises or drops according to the magnitude relationship between the currents Ie and If. Specifically, when the current Id flows so as to discharge the gate electrode of the NMOS transistor 140, and the current Ie is larger than the current If, the operational amplifier circuit 20 raises the output voltage Vout. When the current Id flows so as to charge the gate electrode of the NMOS transistor 140 and the current Ie is smaller than the current If, the operational amplifier circuit 20 lowers the output voltage Vout.

Accordingly, the PMOS transistor 130 and the NMOS transistor 140 apply the output voltage Vout to the output node of the operational amplifier circuit 20, based on the gate voltage Vn that corresponds to the current Id according to the input voltages VP and VM. Note that the PMOS transistor 130 and the transistor 140 correspond to a "first output circuit".

<<Capacitor 150 and Resistor 160>>

The capacitor 150 and the resistor 160 are elements for phase compensation. Specifically, the capacitor 150 and the resistor 160 are coupled in series between the drain electrode of the output of the NMOS transistor 140, which is the amplification stage, and the gate electrode of the input thereof.

==Operation of Operational Amplifier Circuit 20==

===Operation at Rising of Power Supply Voltage Vdd===

At the rising of the power supply voltage Vdd, the operational amplifier circuit 20 does not operate in the state where the PMOS transistor 60 in FIG. 1 is not on.

When the voltage at the drain electrode of the PMOS transistor 100, 130 satisfies a predetermined condition in the state where the PMOS transistor 60 is on, the gate voltage to pass the current Ia, Ie is applied to the PMOS transistor 100, 130.

However, the differential pair 110 has not yet turned on, and the voltage Va at the node A has not dropped low, relative to the power supply voltage Vdd, enough for the PMOS transistor 100 to start passing the current Ia. Thus, the PMOS transistor 100 does not pass the current Ia.

Meanwhile, the PMOS transistor 130 starts passing the current Ie because the voltage at the drain electrode thereof drops enough to start passing the current Ie. However, in this event, the differential pair 110 is not operating, and thus the current Id according to the input voltages VP and VM does not flow, and the current If to be passed by the NMOS transistor 140 is not determined.

Accordingly, even if receiving the gate voltage allowing the current Ia to start flowing through the PMOS transistor 100, the operational amplifier circuit 20 outputs the output voltage Vout at a level different from the desired level, when the differential pair 110 is not turned on.

Thereafter, in response to the power supply voltage Vdd reaching the level V1, the differential pair 110 is turned on so that the current Ia flows, when the input voltages VP and VM reach voltages to turn on the PMOS transistors 112 and 114, respectively.

Upon turning on of the differential pair 110, the current Ic flows through the active load 120, the current Id flows according to the magnitude of the currents Ib and Ic, at the node B, and the current If flows through the NMOS transistor 140. This makes it possible that the operational amplifier circuit 20 applies the desired output voltage Vout according to the input voltages VP and VM, to the output node.

Furthermore, upon receiving the bias voltage Vbias in a state where the power supply voltage Vdd reaches the target level and the PMOS transistor 60 is on, the operational amplifier circuit 20 applies the desired output voltage Vout according to the input voltages VP and VM, to the output node.

As has been explained above, the operational amplifier circuit 20 may output the output voltage Vout at a level different from the desired level, before the power supply voltage Vdd reaches the level V1.

Accordingly, the control circuit 40 controls the state of the output node of the operational amplifier circuit 20 until the power supply voltage Vdd reaches the level V1, so that the operational amplifier circuit 20 does not output the output voltage Vout at a level different from the desired level, which will be described later in detail.

<<Control Circuit 40*a*>>

The control circuit 40*a* is an embodiment of the control circuit 40, and controls the state of the output node of the operational amplifier circuit 20. Specifically, the control circuit 40*a* causes the level of the voltage at the output node to be a predetermined level until the power supply voltage Vdd rises and reaches the level V1. Meanwhile, in response to the power supply voltage Vdd rising and exceeding the level V1, the control circuit 40*a* causes the operational amplifier circuit 20 to apply the output voltage Vout according to the input voltages VP and VM, to the output node.

==Configuration of Control Circuit 40*a*==

The control circuit 40*a* includes a PMOS transistor 200, a differential pair 210, and an output control circuit 220.

<<PMOS Transistor 200>>

The PMOS transistor 200 operates as a current source to pass a current to the differential pair 210. Specifically, the PMOS transistor 200 has a source electrode coupled to the power supply line L1, and a gate electrode to receive the bias voltage Vbias. Then, the PMOS transistor 200 generates a current Iu that is smaller than the current Ia by an amount corresponding to the predetermined times the current Ia, and passes it from the drain electrode thereof to the differential pair 210.

Further, when the voltage at the drain electrode of the PMOS transistor 200 satisfies a predetermined condition in the state where the PMOS transistor 60 of FIG. 1 is on, the gate voltage thereof to pass the current Iu is applied to the PMOS transistor 200. Note that the PMOS transistor 200 corresponds to a "second current source", and the current Iu corresponds to a "second current".

<<Differential Pair 210>>

The differential pair 210 is coupled to the PMOS transistor 200, and is a circuit to divide the current Iu based on the input voltages VP and VM, to thereby pass divided currents. Specifically, the differential pair 210 includes PMOS transistors 212 and 214. Further, in the PMOS transistors 212 and 214, the on-resistances change according to the input voltages VP and VM that are applied to the gate electrodes thereof, respectively.

As a result, the PMOS transistors 212 and 214 divide the current Iu according to the respective on-resistances and passes divided currents as currents Iu0 and Iu1, respectively. Further, when the input voltage VP is higher than the input voltage VM, the on-resistance of the PMOS transistor 212 is larger than the on-resistance of the PMOS transistor 214. In this case, the differential pair 210 divides the current Iu such that the current Iu1 is larger than the current Iu0.

Meanwhile, when the input voltage VP is lower than the input voltage VM, the on-resistance of the PMOS transistor 212 is smaller than the on-resistance of the PMOS transistor 214. In this case, the differential pair 210 divides the current Iu such that the current Iu0 is larger than the current Iu1. Note that the node at which the source electrodes of the PMOS transistors 212 and 214 are coupled to the drain electrode of the PMOS transistor 200 is referred to as node X0, and the voltage at the node X0 is referred to as voltage Vx0.

Further, in response to the power supply voltage Vdd exceeding the level V1, the voltage difference between the power supply voltage Vdd and the voltage Vx0 increases large enough to allow the PMOS transistor 200 to pass the current Iu. Then, when the input voltages VP and VM are low, relative to the voltage Vx0, enough to turn on the PMOS transistors 212 and 214, the PMOS transistors 212 and 214 divide the current Iu to thereby pass divided currents.

Specifically, the ratio Rw10 of the channel width to the channel length of each of the PMOS transistors 212 and 214 configuring the differential pair 210, is a predetermined times the ratio Rw11 of the channel width to the channel length of each of the PMOS transistors 112 and 114 configuring the differential pair 110. Further, as explained with respect to the PMOS transistor 200, the predetermined times correspond to the ratio of the current Iu to the current Ia.

This enables the control circuit 40*a* to detect the level V1 of the power supply voltage Vdd at which the operational amplifier circuit 20 outputs the desired output voltage Vout, without using the reference voltage. Note that the differential pair 210 corresponds to a "second differential pair," the ratio Rw10 corresponds to a "first ratio", and the PMOS transistors 212 and 214 correspond to "a plurality of transistors", and the ratio Rw11 corresponds to a "second ratio".

<<Output Control Circuit 220>>

The output control circuit 220 is coupled to the differential pair 210 and controls the state of the output the node of the operational amplifier circuit 20 according to the current Iu from the differential pair 210. Specifically, the output control circuit 220 changes the level at the output node of the operational amplifier circuit 20 to the predetermined level (e.g., a voltage level of 0 V (hereinafter, referred to as ground voltage)) until the power supply voltage Vdd reaches the level V1. Meanwhile, the output control circuit 220 causes the operational amplifier circuit 20 to apply the output voltage Vout to the output node, in response to the power supply voltage Vdd exceeding the level V1.

The output control circuit 220 includes a PMOS transistor 300, a current generator circuit 310, and a voltage application circuit 320.

<PMOS Transistor 300>

The PMOS transistor 300 operates as a current source. The PMOS transistor 300 has a source electrode coupled to the power supply line L1, and a gate electrode to receive the bias voltage Vbias. The PMOS transistor 300 then generates a current Iv.

Further, when the voltage at the drain electrode of the PMOS transistor 300 satisfies a predetermined condition in the state where the PMOS transistor 60 in FIG. 1 is on, the gate voltage to pass the current Iv is applied to the PMOS transistor 300. Note that the PMOS transistor 300 corresponds to a "first current generator circuit" and a "third current source", and the current Iv corresponds to a "first bias current" and a "third current".

<Current Generator Circuit 310>

The current generator circuit 310 generates a current Iw, based on the current Iu from the differential pair 210 and passes it to the voltage application circuit 320, and configures a current mirror circuit.

Specifically, the current generator circuit 310 includes a diode-coupled NMOS transistor 312 so as to pass the current Iu, and an NMOS transistor 314 having a gate electrode to receive the same gate voltage as that of the NMO transistor 312, and a source electrode that is grounded. Note that the current Iw flows through the NMOS transistor 314.

Further, the current ratio of the current Iw to the current Iu is designed such that the current Iw exceeds the current Iv, in response to the current Iu flowing through the differential pair 210 and the power supply voltage Vdd reaching the level V1. Further, the ratio of the channel width to the channel length of the NMOS transistor 314 is designed with respect to the ratio of the channel width to the channel length of the NMOS transistor 312 so as to correspond to the current ratio of the current Iw to the current Iu.

Note that the current generator circuit 310 corresponds to a "second current generator circuit," and the current Iw corresponds to a "second bias current".

<Voltage Application Circuit 320>

The voltage application circuit 320 controls the state of the output node of the operational amplifier circuit 20 according to the currents Iv and Iw, and includes a switch control circuit 321 and an NMOS transistor 322.

The voltage application circuit 320 changes the level at the output node of the operational amplifier circuit 20 to the predetermined level (e.g., the ground voltage level) since the current Iw is smaller than the current Iv and the voltage Vy at a node Y rises until the power supply voltage Vdd reaches the level V1.

Meanwhile, when the current Iu flows through the differential pair 210 and the power supply voltage Vdd exceeds the level V1, the current Iw exceeds the current Iv and the voltage Vy drops and thus the voltage application circuit 320 causes the operational amplifier circuit 20 to apply the output voltage Vout to the output node. Note that the node Y is a node for subtracting the current Iw outputted from the current generator circuit 310 from the current Iv outputted from the PMOS transistor 300.

(Switch Control Circuit 321 and NMOS Transistor 322)

The switch control circuit 321 turns on and off the NMOS transistor 322 that controls the state of the output node of the operational amplifier circuit 20 according to the voltage Vy. Specifically, the switch control circuit 321 turns on the NMOS transistor 322 since the voltage Vy rises such that the power supply voltage Vdd reaches the level V1. Meanwhile, the switch control circuit 321 turns off the NMOS transistor 322, since the voltage Vy drops in response to the power supply voltage Vdd exceeding the level V1. Further, the switch control circuit 321 includes PMOS transistors 323 and 325 and NMOS transistors 324 and 326.

The PMOS transistor 323 and the NMOS transistor 324 are circuits to output a signal Vz having a voltage level of the power supply voltage Vdd or the ground voltage, based on the voltage Vy, and configure a first inverter circuit. Further, the PMOS transistor 325 and the NMOS transistor 326 are circuits to output a signal Von having a voltage level of the power supply voltage Vdd or the ground voltage, based on the signal Vz, and configure a second inverter circuit.

Further, the first inverter circuit outputs, to the node Z, the signal Vz having the ground voltage level based on the high voltage Vy, until the level of the power supply voltage Vdd reaches the level V1. Further, the second inverter circuit outputs the signal Von having a voltage level of the power supply voltage Vdd, based on the signal Vz having the ground voltage level. In this event, the NMOS transistor 322 is turned on, and the control circuit 40*a* causes the level at the output node of the operational amplifier circuit 20 to be the predetermined level (e.g., the ground voltage level).

Meanwhile, in response to the level of the power supply voltage Vdd exceeding the level V1, the first inverter circuit outputs, to the node Z, the signal Vz having a voltage level of the power supply voltage Vdd, based on the low voltage Vy. Further, the second inverter circuit outputs the signal Von having the ground voltage level, based on the signal Vz to have a voltage level of the power supply voltage Vdd. In this event, the NMOS transistor 322 is turned off, and the control circuit 40*a* causes the operational amplifier circuit 20 to apply the output voltage Vout to the output node. Note that the NMOS transistor 322 corresponds to a "switch".

==Operation of Control Circuit 40*a*==

Figure 3:
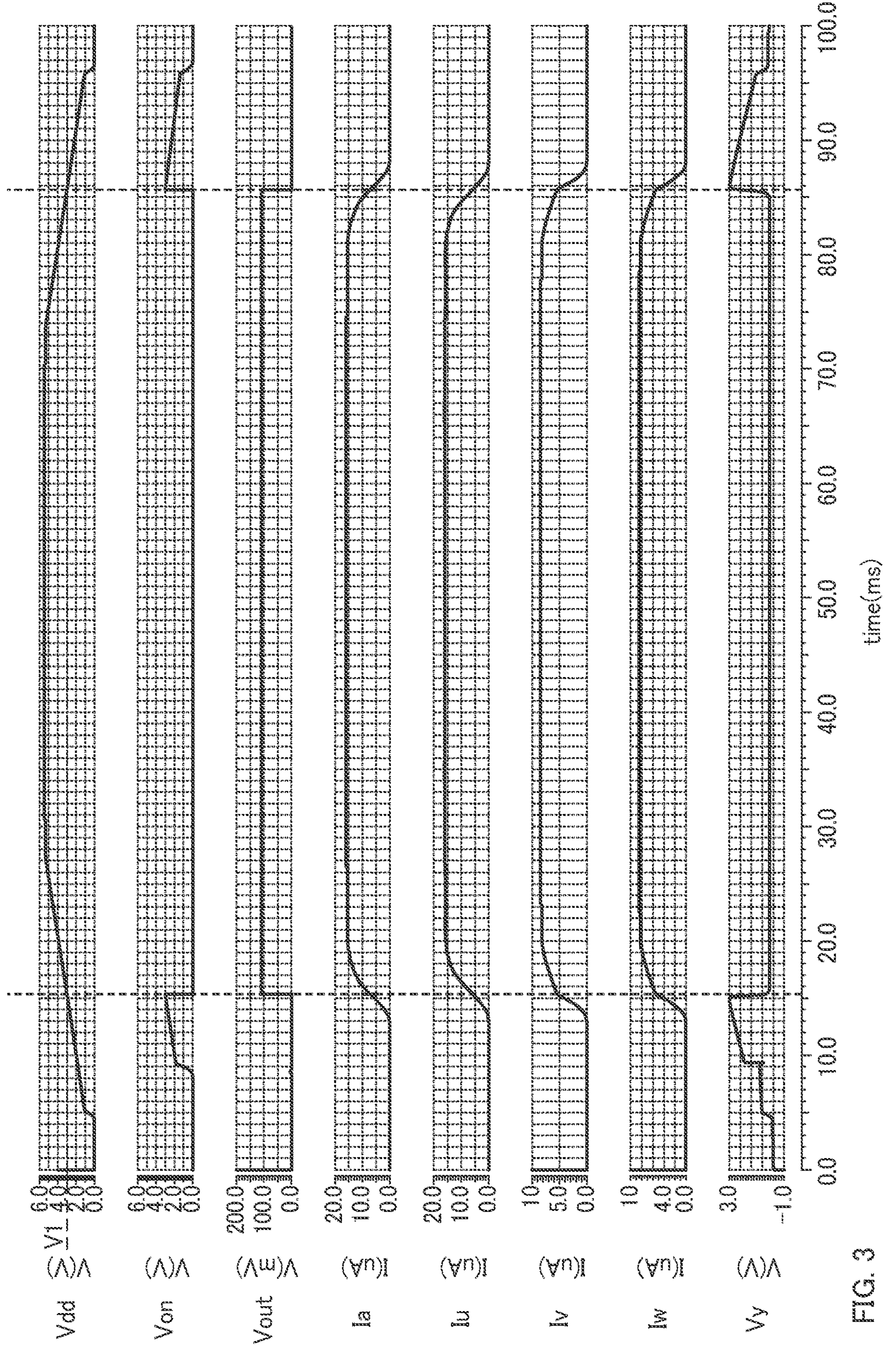
FIG. 3 is a chart illustrating an operation example of a control IC 40*a*.
Figure 4:
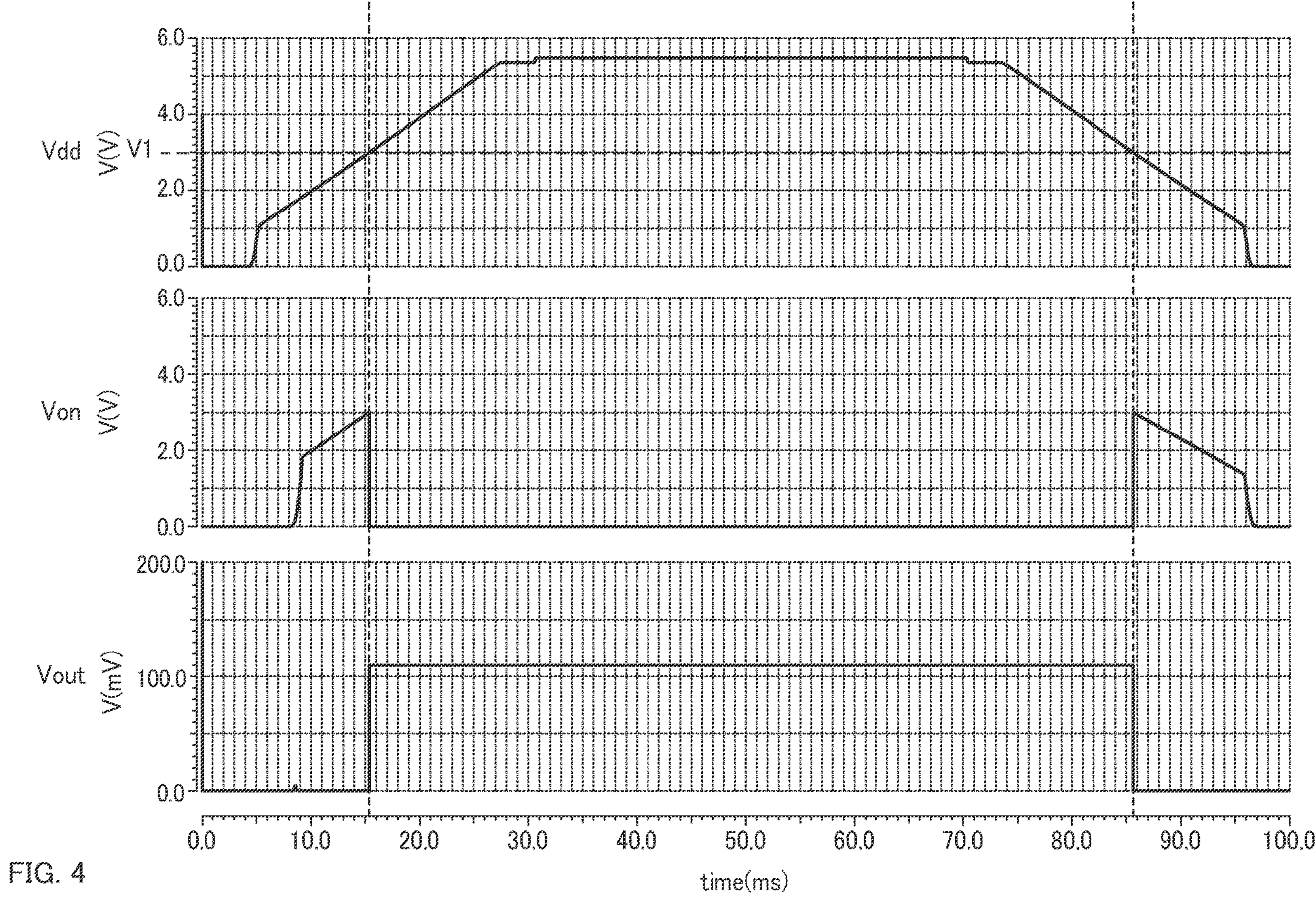
FIG. 4 is an enlarged chart illustrating an operation example of a control IC 40*a*.

FIGS. 3 and 4 are charts illustrating operation examples of the control IC 40*a*. The following describes the operation of the control circuit 40*a* with reference to FIG. 3. Note that FIG. 3 illustrates a result of a simulation by means of such setting that the power supply voltage Vdd is raised from time=0 ms to reach the target level around time=27 ms. In addition, in FIG. 3, the simulation was performed by means of such setting that the power supply voltage Vdd is lowered to the ground voltage after time=75 ms. FIG. 4 is an enlarged chart of the power supply voltage Vdd, the signal Von, and the output voltage Vout in FIG. 3 to illustrate an operation example of the control circuit 40*a*.

=Operation of Control Circuit 40*a* at Rising of Power Supply Voltage Vdd=

At time=0 ms in FIG. 3, a regulator (not illustrated) starts generating the power supply voltage Vdd from the power supply voltage Vcc. However, at this point, the power supply voltage Vdd is still substantially at the ground voltage. Thus, the currents and voltages of the operational amplifier circuit 20 and the control circuit 40*a* are substantially zero.

Around time=5 ms, the regulator raises the power supply voltage Vdd from the ground voltage to about 1 V, for example. In this event, since the PMOS transistor 60 in FIG. 1 is not turned on, the PMOS transistors 100, 200, and 300, which are the current sources, do not pass the currents Ia, Iu, and Iv, respectively, and thus the current generator circuit 310 does not pass the current Iw, either, and thus the differential pairs 110 and 210 are also off.

Around time=9 ms, the regulator raises the power supply voltage Vdd to about 2 V, for example. In this event, the PMOS transistor 60 in FIG. 1 is turned on, and the PMOS transistors 100, 200, and 300 results in receiving the gate voltage to pass the currents Ia, Iu, and Iv, respectively, if the voltages at the drain electrodes satisfy predetermined condition.

However, since the differential pairs 110 and 210 have not yet been turned on, the PMOS transistors 100, 200, and 300 do not pass the currents Ia, Iu, and Iv, respectively. Accordingly, the current generator circuit 310 does not pass the current Iw, either.

Further, since the gate voltage of the NMOS transistor 314 is low and the resistance value of the PMOS transistor 300 is smaller than that thereof, the voltage Vy at the node Y rises. Further, since the voltage Vy is high, the voltage level of the signal Von exceeds the threshold voltage of the NMOS transistor 322, and the NMOS transistor 322 is turned on. As a result, the control circuit 40*a* causes the level at the output node of the operational amplifier circuit 20 to be the ground voltage level. Thereafter, the voltage level of the signal Von rises with a rise in the power supply voltage Vdd, but the NMOS transistor 322 continues to be on.

The regulator raises the power supply voltage Vdd to the level V1 (e.g., 3 V) around time=15 ms. In this event, the PMOS transistor 300 has already been passing the current Iv, and after the differential pair 210 is turned on, the current Iw exceeds the current Iv, and thus the voltage Vy at the node Y drops. In response to a drop in the voltage Vy, the second inverter circuit outputs the signal Von at the ground voltage level, and the NMOS transistor 322 is turned off. As a result, the control circuit 40*a* causes the operational amplifier circuit 20 to apply the output voltage Vout to the output node. Further, when the differential pair 210 is turned on, the differential pair 110 is also turned on. Furthermore, with the timings at which the differential pairs 110 and 210 are turned on being aligned, the control circuit 40*a* can cause the operational amplifier circuit 20 to apply the output voltage Vout to the output node at the timing at which the operational amplifier circuit 20 operates stably.

From the above, as illustrated in FIG. 4, the control circuit 40*a* causes the level at the output node of the operational amplifier circuit 20 to be the ground voltage level until the power supply voltage Vdd reaches the level V1. Then, in response to the power supply voltage Vdd exceeding the level V1, the control circuit 40*a* causes the operational amplifier circuit 20 to apply the desired output voltage Vout according to the input voltages VP and VM, to the output node.

=Operation of Control Circuit 40*a* at Falling of Power Supply Voltage Vdd=

Around time=75 ms in FIG. 3, the regulator starts to lower the power supply voltage Vdd from the target level. In this event, the PMOS transistor 60 in FIG. 1 is on, the differential pair 210 is also on, and the current Iw is larger than the current Iv, and thus the voltage Vy is the ground voltage level. Accordingly, the second inverter circuit outputs the signal Von at the ground voltage level, and the NMOS transistor 322 is off. As a result, the control circuit 40*a* causes the operational amplifier circuit 20 to apply the output voltage Vout to the output node.

Around time=86 ms, the regulator lowers the power supply voltage Vdd to the level V1. In this event, the differential pairs 110 and 210 are on, but the difference between the voltage Vx0 at the node X0 and the power supply voltage Vdd decreases, and the PMOS transistor 200 starts reducing the current Iu, and the current Iw decreases smaller than the current Iv. Thus, the voltage Vy rises. Accordingly, the second inverter circuit outputs the signal Von at the voltage level of the power supply voltage Vdd, to thereby turn on the NMOS transistor 322. Thereafter, the differential pair 210 is turned off, and the differential pair 110 is also turned off, but the PMOS transistor 300 is passing the current Iv, and the voltage Vy remains high. As a result, the control circuit 40*a* causes the level at the output node of the operational amplifier circuit 20 to be the ground voltage level.

Further, with the timings at which the differential pairs 110 and 210 are turned off being aligned, the control circuit 40*a* causes the level at the output the node of the operational amplifier circuit 20 to be the ground voltage level, at the timing at which the operational amplifier circuit 20 stops operating stably.

Around time=96 ms, the regulator lowers the power supply voltage Vdd to about substantially 1 V. In this event, the PMOS transistor 60 is turned off, and the PMOS transistors 100, 200, and 300 are also turned off, so that they do not pass the currents Ia, Iu, and Iv, respectively. Thus, the currents and voltages of the operational amplifier circuit 20 and the control circuit 40*a* are substantially zero.

From the above, as illustrated in FIG. 4, when the power supply voltage Vdd is higher than the level V1, the control circuit 40*a* causes the operational amplifier circuit 20 to apply the desired output voltage Vout according to the input voltages VP and VM, to the output node. Then, in response to the power supply voltage Vdd falling below the level V1, the control circuit 40*a* causes the level at the output node of the operational amplifier circuit 20 to the ground voltage level.

===Modifications===

<<Control Circuit 40*b*>>

Figure 5:
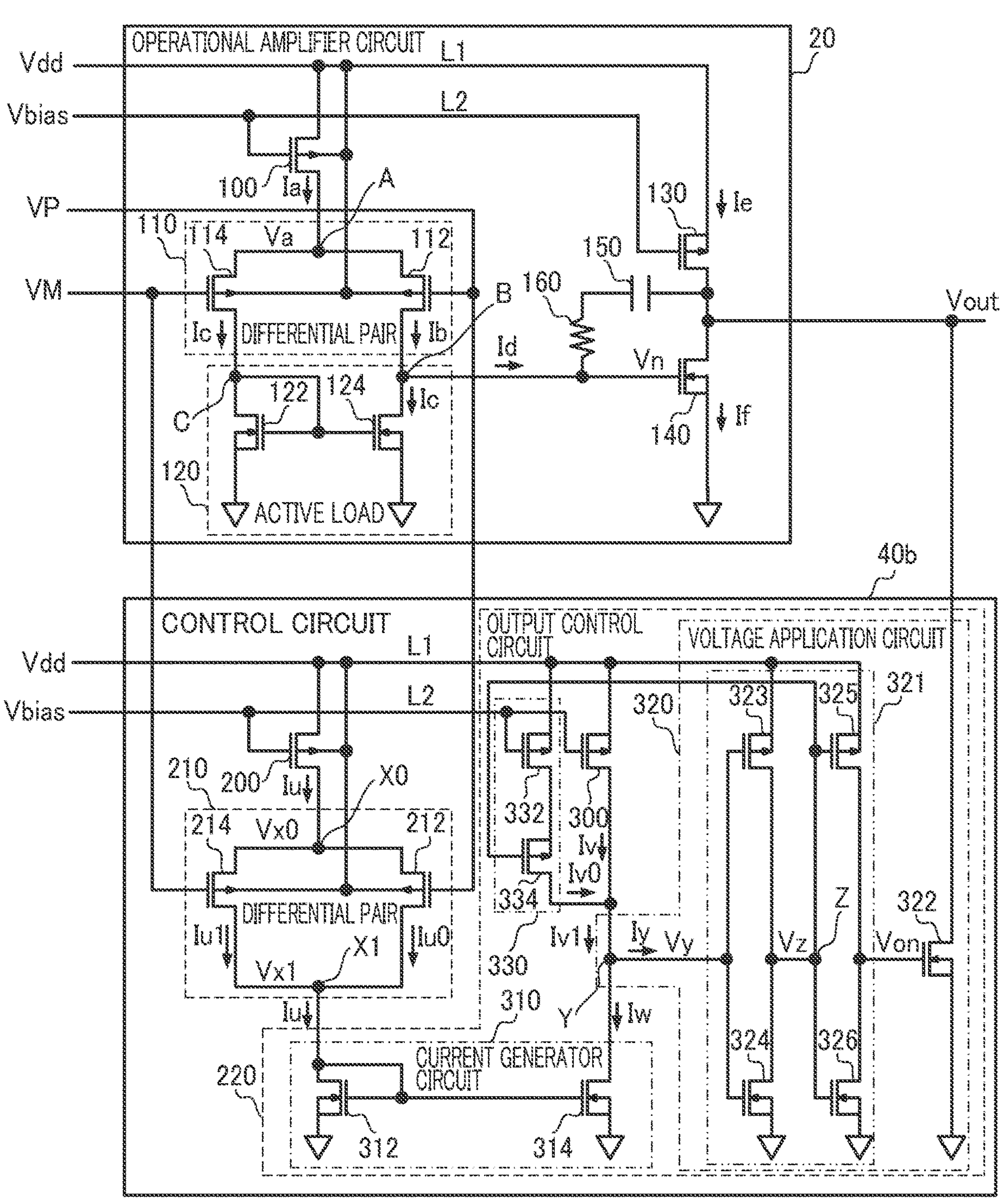
FIG. 5 is a diagram illustrating examples of an operational amplifier circuit 20 and a control circuit 40*b*.

FIG. 5 is a diagram illustrating examples of the operational amplifier circuit 20 and the control circuit 40*b*. Further, the control circuit 40*b* is an embodiment of the control circuit 40. When the power supply voltage Vdd is rising, the control circuit 40*b* causes the level at the output node of the operational amplifier circuit 20 to be the predetermined level (e.g., the ground voltage level) until the power supply voltage Vdd reaches the level V2 higher than the level V1, for example. Meanwhile, the control circuit 40*b* causes the operational amplifier circuit 20 to apply the desired output voltage Vout according to the input voltages VP and VM, to the output node, in response to the power supply voltage Vdd exceeding the level V2.

Then, when the power supply voltage Vdd falls, the control circuit 40*b* causes the operational amplifier circuit 20 to apply the desired output voltage Vout according to the input voltages VP and VM, to the output node, until the power supply voltage Vdd reaches the level V2. Meanwhile, the control circuit 40*b* causes the level at the output node of the operational amplifier circuit 20 to be the predetermined level, in response to the power supply voltage Vdd falling below the level V2.

Accordingly, the control circuit 40*b* is able to have the hysteresis characteristics with respect to the power supply voltage Vdd, and even when the power supply voltage Vdd fluctuates after exceeding the level V2, the control circuit 40*b* is able to continue to apply the desired output voltage Vout to the output node of the operational amplifier circuit 20.

==Configuration of Control Circuit 40*b*==

The control circuit 40*b* includes the PMOS transistor 200, the differential pair 210, and the output control circuit 220. Note that the PMOS transistor 200 and the differential pair 210 are the same as or similar to those of the control circuit 40*a*.

The output control circuit 220 includes the PMOS transistor 300, the current generator circuit 310, the voltage application circuit 320 and a current output circuit 330. Note that the PMOS transistor 300, the current generator circuit 310, and the voltage application circuit 320 are the same as or similar to those of the control circuit 40*a*.

<Current Output Circuit 330>

The current output circuit 330 is a current source for implementing the hysteresis characteristics, and passes a current Iv0 to the node Y, as with the PMOS transistor 300, in response to the signal Vz from the voltage application circuit 320. In other words, when the level at the output node of the operational amplifier circuit 20 is the ground voltage level, the current output circuit 330 generates the current Iv0 according to the power supply voltage Vdd and the bias voltage Vbias. Meanwhile, the current output circuit 330 stops generating the current Iv0 when the output voltage Vout is applied to the output node of the operational amplifier circuit 20. Further, the current output circuit 330 includes PMOS transistors 332 and 334.

The PMOS transistor 332 is turned on upon turning on of the PMOS transistor 60 in FIG. 1. When the signal Vz at the ground voltage level is applied to the gate electrode of the PMOS transistor 334, the current output circuit 330 causes the current from the PMOS transistor 332 to flow to the node Y as the current Iv0. Note that when the signal Vz reaches the ground voltage level, the control circuit 40*b* causes the level of the voltage at the output node of the operational amplifier circuit 20 to be the ground voltage level.

Meanwhile, in response to the signal Vz at the voltage level of the power supply voltage Vdd being applied to the gate electrode of the PMOS transistor 334, the current output circuit 330 interrupts the current from the PMOS transistor 332, and does not allow the current Iv0 to flow to the node Y. Note that when the signal Vz reaches the voltage level of the power supply voltage Vdd, the control circuit 40*b* causes the operational amplifier circuit 20 to apply the desired output voltage Vout to the output node.

Accordingly, at the rising of the power supply voltage Vdd, a current Iv1 flowing through the node Y is the current obtained by adding the current Iv from the PMOS transistor 300 and the current Iv0 from the PMOS transistor 332, until the power supply voltage Vdd reaches the level V2 higher than the level V1, for example.

Meanwhile, in response to the power supply voltage Vdd exceeding the level V2, the current Iv1 flowing through the node Y becomes equal to the current Iv from the PMOS transistor 300. Then, at the falling of the power supply voltage Vdd, the current Iv1 remains equal to the current Iv, until the power supply voltage Vdd reaches the level V1.

Thereafter, in response to the power supply voltage Vdd falling below the level V1, the current Iv1 becomes equal to the current obtained by adding the current Iv from the PMOS transistor 300 and the current Iv0 from the PMOS transistor 332.

This makes it possible to have the hysteresis characteristics with respect to the power supply voltage Vdd.

This suppresses the possibility of changing control of the state of the output node of the operational amplifier circuit 20, as long as the power supply voltage Vdd does not reach the level V1, even if it fluctuates after exceeding the level V2. Accordingly, the voltage output circuit 10 is able to operate stably. Note that the current Iv0 corresponds to a "fourth current".

==Operation of Control Circuit 40*b*==

Figure 6:
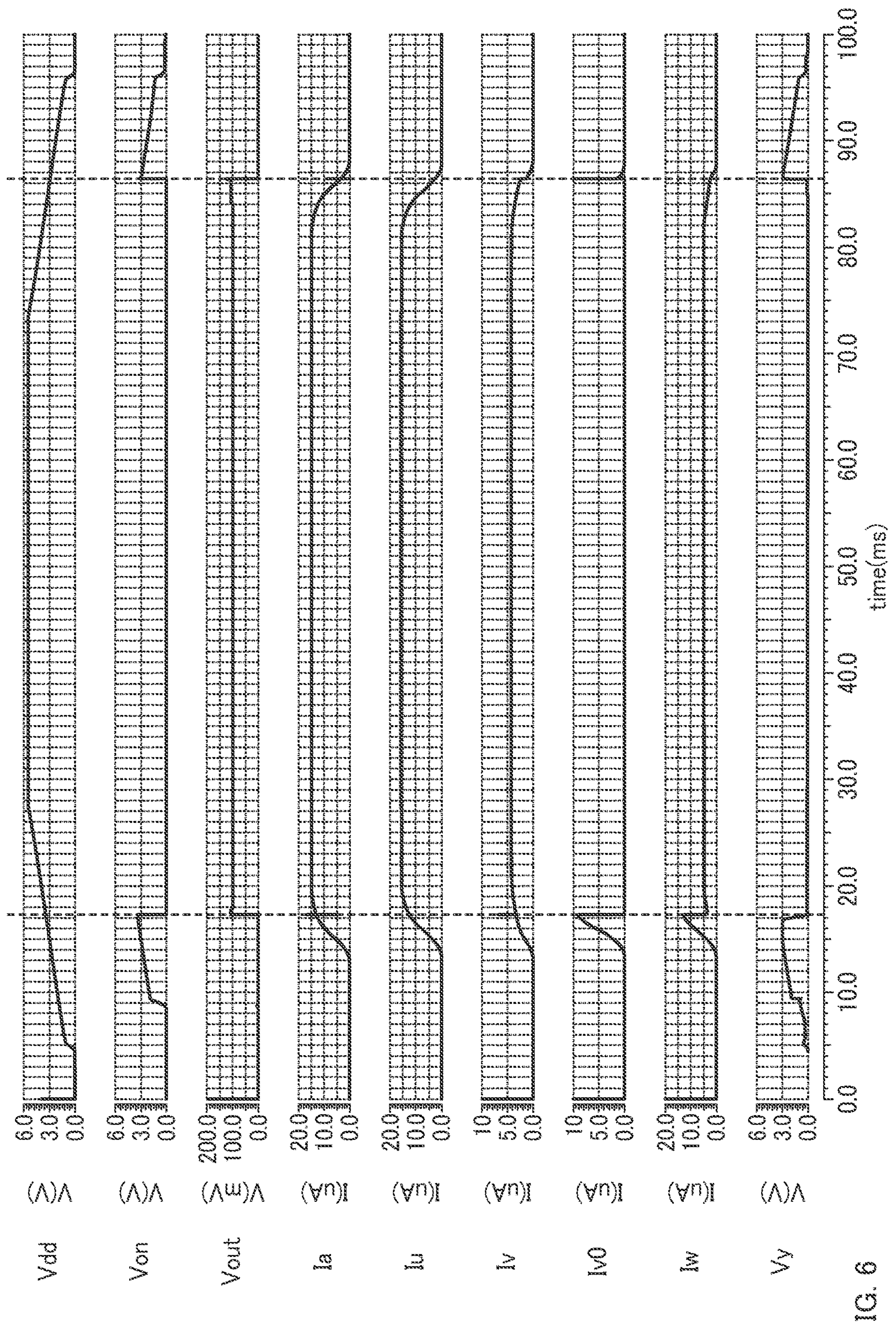
FIG. 6 is a chart illustrating an operation example of a control circuit 40*b*.
Figure 7:
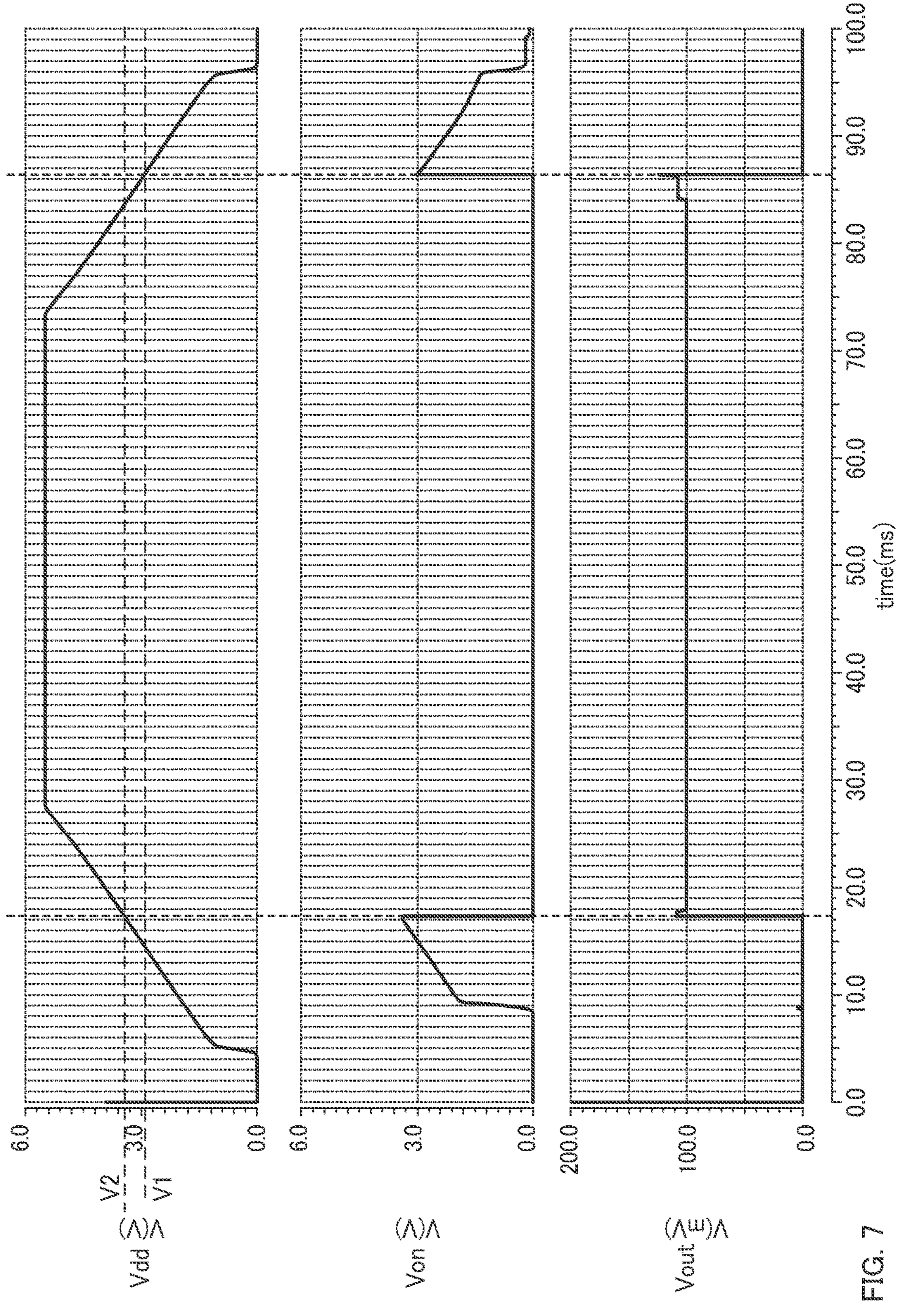
FIG. 7 is an enlarged chart for explaining the hysteresis characteristics of a control circuit 40*b*.

FIGS. 6 and 7 are charts illustrating operation examples of the control circuit 40*b*. The following describes the operation of the control circuit 40*b* with reference to FIG. 6. FIG. 6 illustrates a result of a simulation performed, with the rising and falling of the power supply voltage Vdd being set as in FIG. 3. FIG. 7 is an enlarged view of the supply voltage Vdd, the signal Von, and the output voltage Vout in FIG. 6 to illustrate the hysteresis characteristics of the control circuit 40*b*.

=Operation of Control Circuit 40*b* at Rising of Power Supply Voltage Vdd=

The regulator starts generating the power supply voltage Vdd from the power supply voltage Vcc at time=0 ms in FIG. 6. However, at this point, the power supply voltage Vdd is still substantially the ground voltage. Thus, the currents and voltages of the operational amplifier circuit 20 and the control circuit 40*b* are substantially zero.

The regulator raises the power supply voltage Vdd from the ground voltage to about 1V at around time=5 ms. In this event, the PMOS transistor 60 in FIG. 1 is not on, and thus the PMOS transistor 100, 200, 300, and the current output circuit 330, which are current sources, do not pass the currents Ia, Iu, Iv, and Iv0, respectively. Accordingly, the current generator circuit 310 does not pass the current Iw. Further, the differential pairs 110 and 210 are off. The second inverter circuit outputs the signal Von substantially at the ground voltage level, since the power supply voltage Vdd is low.

The regulator raises the supply voltage Vdd to about 2 V at around time=9 ms. In this event, the PMOS transistor 60 in FIG. 1 is turned on, and the PMOS transistors 100, 200, 300, and 332 receive the gate voltages to pass the currents Ia, Iu, Iv, and Iv0, respectively, if the voltages at the drain electrodes thereof satisfy predetermined condition.

However, since the voltages at the drain electrodes still do not satisfy the predetermined condition, the PMOS transistors 100, 200, 300, and 332 do not pass the currents Ia, Iu, Iv, and Iv0, respectively. Accordingly, the current generator circuit 310 does not pass the current Iw.

Further, the gate voltage of the NMOS transistor 314 is low and the resistance values of the PMOS transistors 300 and 332 are smaller than that thereof, and thus the voltage Vy at the node Y is substantially 2 V, as with the power supply voltage Vdd. In addition, the voltage level of the signal Von exceeds the threshold voltage of the NMOS transistor 322, and the NMOS transistor 322 is turned on. As a result, the control circuit 40*b* causes the level at the output node of the operational amplifier circuit 20 to be the ground voltage level. Thereafter, the voltage level of the signal Von rises with a rise in the supply voltage Vdd, but the NMOS transistor 322 remains on.

The regulator raises the supply voltage Vdd to about 3 V at around time=13.5 ms. In this event, the PMOS transistor 60 in FIG. 1 has already been on, and the PMOS transistor 300 starts to pass the current Iv, because the voltage at the drain electrode satisfies the predetermined condition. Further, the PMOS transistor 332 also starts to pass the current Iv0 similarly. Thus, the voltage Vy results in a high voltage. Accordingly, the second inverter circuit continues to output the voltage Von to turn on the NMOS transistor 322.

Further, the PMOS transistors 100 and 200 also pass the currents Ia and Iu, respectively, because the differential pairs 110 and 210 are turned on. However, the current generator circuit 310 passes the current Iw smaller than the current Iv1. Accordingly, the voltage Vy results in a high voltage. Note that the differential pairs 110 and 210 are turned on at the same timing.

The regulator raises the supply voltage Vdd to the level V2 (e.g., a voltage higher than 3 V), as illustrated in FIG. 6 around time=17 ms. In this event, since the current Iw exceeds the current Iv1, the voltage Vy at the node Y drops, as illustrated in FIG. 5. In response to the voltage Vy dropping, the second inverter circuit outputs the signal Von at the ground voltage level, and the NMOS transistor 322 is turned off.

As a result, the control circuit 40*b* causes the operational amplifier circuit 20 to apply the output voltage Vout to the output node. Note that, at this point, the signal Vz reaches the voltage level of the power supply voltage Vdd, and thus the PMOS transistor 334 is turned off. Accordingly, the current output circuit 330 does not pass the current Iv0.

From the above, as illustrated in FIG. 7, at the rising of the power supply voltage Vdd, the control circuit 40*b* causes the level at the output node of the operational amplifier circuit 20 to be the ground voltage level, until the power supply voltage Vdd reaches the level V2. Then, in response to the power supply voltage Vdd exceeding the level V2, the control circuit 40*b* causes the operational amplifier circuit 20 to apply the desired output voltage Vout according to the input voltages VP and VM, to the output node.

=Operation of Control Circuit 40*b* at Falling of Power Supply Voltage Vdd=

The regulator starts to lower the power supply voltage Vdd from the target level at around time=75 ms in FIG. 6. In this event, the second inverter circuit outputs the signal Von at the ground voltage level for causing the NMOS transistor 322 to be off. Accordingly, the signal Vz is at the voltage level of the power supply voltage Vdd, the PMOS transistor 334 is off, and the current output circuit 330 does not pass the current Iv0.

Further, the PMOS transistors 100, 200, and 300 are on, and thus pass the current Ia, the current Iu, and the current Iv, respectively. Since the current Iu is flowing, the current generator circuit 310 passes the current Iw. Further, since the current Iw is larger than the current Iv, the voltage Vy results in the ground voltage level. Accordingly, the second inverter circuit outputs the signal Von at the ground voltage level, and the NMOS transistor 322 is off.

As a result, the control circuit 40*a* causes the operational amplifier circuit 20 to apply the output voltage Vout to the output node.

The regulator lowers the power supply voltage Vdd to about 3 V at around time=83 ms. In this event, the difference between the power supply voltage Vdd and the voltage Vx0 at the node X0 decreases, and the PMOS transistor 200 starts reducing the current Iu. Since the drain-source voltage of the PMOS transistor 300 also decreases, the PMOS transistor 300 also starts reducing the current Iv. Since the current Iu decreases, the current generator circuit 310 also starts reducing the current Iw.

The regulator causes the supply voltage Vdd to be at the level V1 (i.e., substantially 3 V). In this event, the difference between the supply voltage Vdd and the voltage Vx0 at the node X0 decreases, and the voltage Vy rises to be a high voltage, because the PMOS transistor 200 reduces the current Iu and the current Iw becomes smaller than the current Iv. Accordingly, the second inverter circuit outputs the signal Von at the voltage level of the supply voltage Vdd, to turn on the NMOS transistor 322. In this case, the signal Vz reaches the ground voltage level, and thus the PMOS transistor 334 is turned on. As a result, the control circuit 40*b* causes the level at the output node of the operational amplifier circuit 20 to be the ground voltage level. Note that in response to the power supply voltage Vdd reaching the level V1, the differential pairs 110 and 210 are turned off at the same timing.

The regulator lowers the power supply voltage Vdd to about 1V at around time=96 ms. In this event, the PMOS transistor 60 in FIG. 1 is turned off, and the PMOS transistors 100, 200, and 300 are also turned off, and thus do not pass the currents Ia, Iu, and Iv, respectively. Further, the current output circuit 330 does not pass the current Iv0, either, because the PMOS transistor 332 is turned off. Thus, the currents and voltages of the operational amplifier circuit 20 and the control circuit 40*b* are substantially zero.

From the above, as illustrated in FIG. 7, in the case where the power supply voltage Vdd is higher than the level V1 when the power supply voltage Vdd is falling, the control circuit 40*b* causes the operational amplifier circuit 20 to apply the desired output voltage Vout according to the input voltages VP and VM, to the output node. Then, in response to the power supply voltage Vdd dropping below the level V1, the control circuit 40*b* causes the level at the output node of the operational amplifier circuit 20 to be the ground voltage level.

Further, the current value of the current Iw is determined by the voltage level of the power supply voltage Vdd. With the current output circuit 330 causing the current Iv0 to flow or stop flowing depending on the state of the output node of the operational amplifier circuit 20, the control circuit 40*b* changes the current value of the current Iw that is needed to turn on or off the NMOS transistor 322.

Thus, as illustrated in FIG. 7, the control circuit 40*b* is able to have the hysteresis characteristics with respect to the voltage level of the power supply voltage Vdd when performing control such that the state of the output node of the operational amplifier circuit 20 is changed at the rising and falling of the power supply voltage Vdd.

Accordingly, as illustrated in FIG. 7, the control circuit 40*b* causes the level at the output node of the operational amplifier circuit 20 to be the ground voltage level, until the power supply voltage Vdd reaches the level V2 higher than the level V1. Then, in response to the power supply voltage Vdd exceeding the level V2, the control circuit 40*b* causes the operational amplifier circuit 20 to apply the desired output voltage Vout according to the input voltages VP and VM, to the output node.

Meanwhile, in response to the power supply voltage Vdd falling below the level V1, the control circuit 40*b* causes the level at the output the node of the operational amplifier circuit 20 to be the ground voltage level. Accordingly, the operational amplifier circuit 20 starts operating stably, and even if the power supply voltage Vdd fluctuates while the operational amplifier circuit 20 is applying the desired output voltage Vout to the output node, the control circuit 40*b* is restrained from changing the state of the output node.

SUMMARY

The power supply device 10 according to an embodiment of the present disclosure has been described above. The control circuit 40*a* includes the PMOS transistor 200, the differential pair 210, and the output control circuit 220. The output control circuit 220 causes the level at the output node of the operational amplifier circuit 20 to be the ground voltage level, until the level of the power supply voltage Vdd reaches the level V1. Meanwhile, the output control circuit 220 causes the operational amplifier circuit 20 to apply the output voltage Vout to the output node, in response to the power supply voltage Vdd exceeding the level V1. This enables the control circuit 40*a* to determine the voltage level of the power supply voltage Vdd at which the operational amplifier circuit 20 starts to operate stably, without using the reference voltage to determine the voltage level of the power supply voltage Vdd. Accordingly, it is possible to provide the control circuit capable of suppressing variations in the level of the power supply voltage at which the output of the operational amplifier circuit is enabled.

Further, the output control circuit 220 includes the PMOS transistor 300, the current generator circuit 310, and the voltage application circuit 320. The current generator circuit 310 generates the current Iw smaller than the current Iv, until the power supply voltage Vdd reaches the level V1. Meanwhile, the current generator circuit 310 generates the current Iw larger than the current Iv, in response to the power supply voltage Vdd exceeding the level V1. Accordingly, with the characteristics of the PMOS transistors 100 and 200 and the differential pairs 110 and 210 being matched, the control circuit 40*a* can determine the voltage level of the power supply voltage Vdd at which the operational amplifier circuit 20 operates stably, using currents instead of voltages.

Further, the PMOS transistor 300 generates the current Iv according to the power supply voltage Vdd and the bias voltage Vbias. This enables the control circuit 40*a* to determine the voltage level of the power supply voltage Vdd at which the operational amplifier circuit 20 operates stably, using currents instead of voltages.

Further, the current source configured to generate the current Iv1 includes the PMOS transistor 300 and the current output circuit 330. The current Iv1 is obtained by adding the current Iv passed by the PMOS transistor 300 and the current Iv0 passed by the current output circuit 330. This enables the control circuit 40*b* to have the hysteresis function with respect to the power supply voltage Vdd, and suppress unstable control of the output node of the operational amplifier circuit 20 caused by fluctuations in the power supply voltage Vdd.

Further, the voltage application circuit 320 includes the switch control circuit 321 and the NMOS transistor 322. This enables the control circuit 40*a* to turn on and off the NMOS transistor 322, according to the voltage Vy determined based on the currents Iv and Iw. This enables the control circuit 40*a* to control the state of the output node of the operational amplifier circuit 20, based on the currents Iv and Iw.

Further, the magnitude of the current Iu is the predetermined times the magnitude of the current Ia. Then, the ratio of the channel width to the channel length of each of the PMOS transistors 212 and 214 configuring the differential pair 210 is the predetermined times the ratio of the channel width to the channel length of each of the PMOS transistors 112 and 114 configuring the differential pair 110. Accordingly, the characteristics of the PMOS transistors 100 and 200 are matched, and the characteristics of the differential pairs 110 and 210 are also matched. Thus, the control circuit 40*a* can accurately determine the voltage level of the power supply voltage Vdd at which the operational amplifier circuit 20 starts operating stably.

The present disclosure is directed to provision of a control circuit capable of suppressing variations in the level of a power supply voltage at which the output of an operational amplifier circuit is enabled.

According to the present disclosure, it is possible to suppress variations in the level of the power supply voltage at which the output of the operational amplifier circuit is enabled.

Embodiment (s) and modification (s) of the present disclosure described above are simply to facilitate understanding of the present disclosure and are not in any way to be construed as limiting the present disclosure. The present disclosure may variously be changed or altered without departing from its essential features and encompass equivalents thereof.

What is claimed is:

1. A control circuit configured to control an output node of an operational amplifier circuit that includes
- a first current source configured to receive a power supply voltage and a bias voltage, and to generate a first current according to the power supply voltage and the bias voltage,
- a first differential pair configured to receive a pair of input voltages, and to allow the first current to flow therethrough, and
- a first output circuit configured to apply an output voltage according to the input voltages, to the output node, in response to the power supply voltage exceeding a first level, the control circuit comprising:
- a second current source configured to receive the power supply voltage and the bias voltage, and to generate a second current according to the power supply voltage and the bias voltage;
- a second differential pair configured to receive the pair of input voltages, and to allow the second current to flow therethrough; and
- an output control circuit coupled to the second differential pair, the output control circuit being configured to control a state of the output node, wherein the output control circuit is configured to
- cause a level at the output node to be a predetermined level, until a level of the power supply voltage reaches the first level, and
- cause the output voltage to be applied to the output node, in response to the level of the power supply voltage exceeding the first level.

2. The control circuit according to claim 1, wherein the output control circuit includes
- a first current generator circuit configured to generate a first bias current,
- a second current generator circuit configured to generate a second bias current according to the second current, and
- a voltage application circuit configured to
  - cause the level at the output node to be the predetermined level, when the first bias current is larger than the second bias current, and
  - cause the output voltage to be applied to the output node, when the first bias current is smaller than the second bias current, and the second current generator circuit
- generates the second bias current smaller than the first bias current, until the level of the power supply voltage reaches the first level, and
- generates the second bias current larger than the first bias current, in response to the level of the power supply voltage exceeding the first level.

3. The control circuit according to claim 2, wherein the first current generator circuit includes a third current source configured to generate a third current according to the power supply voltage and the bias voltage, as the first bias current.

4. The control circuit according to claim 2, wherein the first current generator circuit includes
- a third current source configured to generate a third current according to the power supply voltage and the bias voltage; and
- a current output circuit configured to
  - generate a fourth current according to the power supply voltage and the bias voltage, when the level at the output node is the predetermined level, and
  - stop generating the fourth current, when the output voltage is applied to the output node, and the first bias current is obtained by adding the third current and the fourth current.

5. The control circuit according to claim 2, wherein the voltage application circuit includes
- a switch provided between the output node and a ground, and
- a switch control circuit configured to
  - turn on the switch, when the first bias current is larger than the second bias current, and
  - turn off the switch, when the first bias current is smaller than the second bias current.

6. The control circuit according to claim 1, wherein the second current source generates the second current smaller than the first current.

7. The control circuit according to claim 6, wherein
- a magnitude of the second current is predetermined times a magnitude of the first current, and
- each of the first differential pair and the second differential pair includes a plurality of transistors, wherein
- a channel width to a channel length of each of the plurality of transistors configuring the first differential pair is a first ratio, a channel width to a channel length of each of the plurality of transistors configuring the second differential pair is a second ratio, and the second ratio is the predetermined times the first ratio.

8. A voltage output circuit comprising:

an operational amplifier circuit having an output node; and a control circuit configured to control a state of the output node of the operational amplifier circuit, wherein the operational amplifier circuit includes:

a first current source configured to receive a power supply voltage and a bias voltage, and to generate a first current according to the power supply voltage and the bias voltage, a first differential pair configured to receive a pair of input voltages, and to allow the first current to flow therethrough, and a first output circuit configured to apply an output voltage according to the input voltages, to the output node, in response to the power supply voltage exceeding a first level;

the control circuit includes:

a second current source configured to receive the power supply voltage and the bias voltage, and to generate a second current according to the power supply voltage and the bias voltage, a second differential pair configured to receive the input voltages, and to allow the second current to flow therethrough, and an output control circuit coupled to the second differential pair, the output control circuit being configured to control a state of the output node; and the output control circuit is configured to cause a level at the output node to be a predetermined level, until a level of the power supply voltage reaches the first level, and cause the output voltage to be applied to the output node, in response to the level of the power supply voltage exceeding the first level.

* * * * *